SELF-LATCHING OSCILLATOR

Filed Nov. 25, 1952

INVENTOR
Jerrier A. Haddad
BY John F. Hanifin
ATTORNEY 2,778,939

SELF-LATCHING OSCILLATOR

Jerrier A. Haddad, Fishkill, N. Y., assignor to International Business Machines Corporation, New York, N. Y., a corporation of New York Application November 25, 1952, Serial No. 322,436

5 Claims. (Cl. 250—36)

Figure 1:
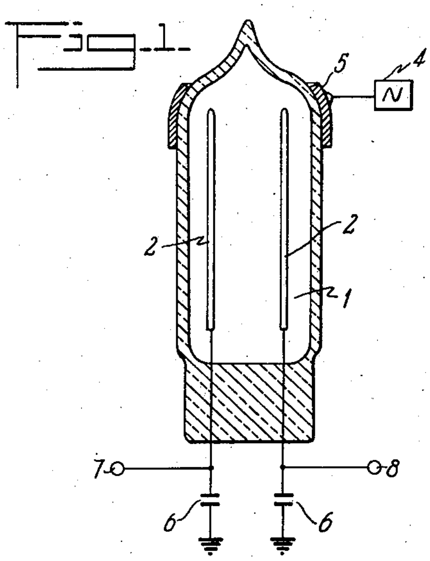

This invention relates broadly to a high frequency oscillator and more particularly to a self-latching oscillator.

Many forms of electron tube oscillators are non-oscillating except during time intervals when they are energized by external means. One example of such an oscillator has the grid connected to a negative bias sufficient to render the tube non-conducting. This type of oscillator is energized by making the bias potential more positive, usually by the application of an electrical pulse, the oscillator operating for a time equal to the duration of the pulse.

In some applications it is desirable to use a self-latching oscillator, i. e., an oscillator normally biased beyond its operating condition, but one which, when pulsed into operating condition, remains in operation after the energizing pulse is removed. Therefore, it is an object of this invention to provide a circuit arrangement for a self-latching oscillator.

Another object is to provide a novel circuit arrangement for a high frequency oscillator.

Another object is to provide an oscillator having means in the load circuit to sustain operation of the oscillator once oscillation starts.

Another object is to provide a high frequency controlled tube adapted to sustain operation of an oscillator, once oscillation starts.

Other objects of the invention will be pointed out in the following description and claims and illustrated in the accompanying drawings, which disclose, by way of example, the principle of the invention and the best mode, which has been contemplated, of applying that principle.

Figure 2:
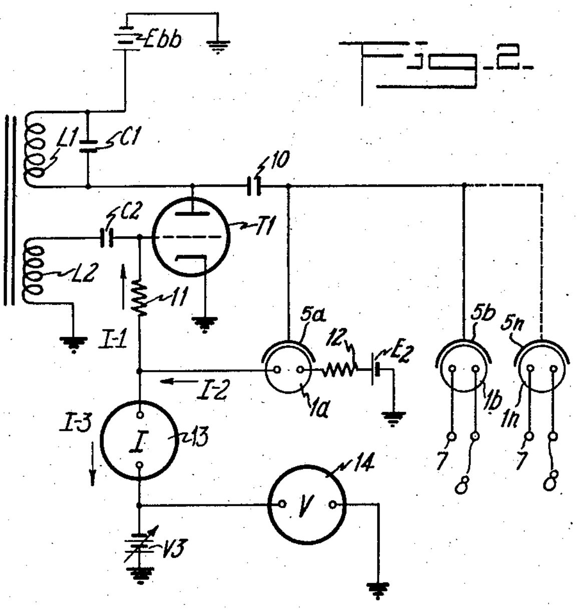
Figure 3:
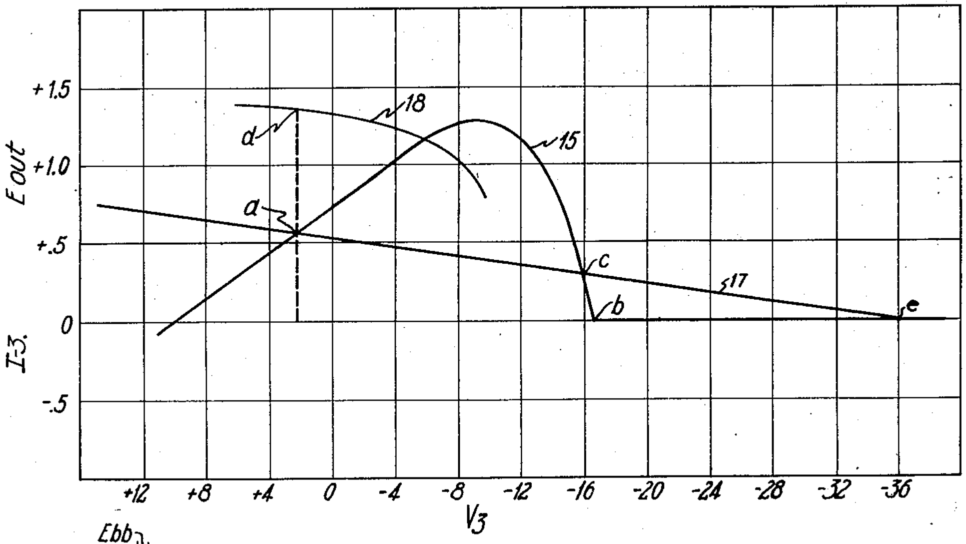
Figure 4:
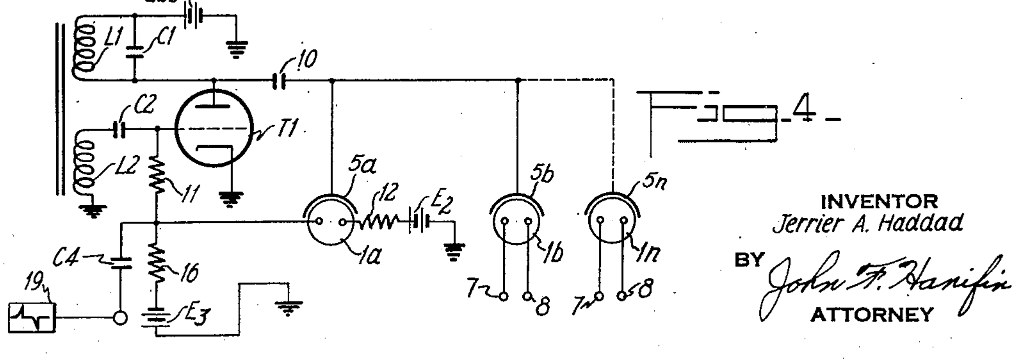

In the drawings:

Fig. 1 is a diagram of a neon switch tube;

Fig. 2 diagrammatically illustrates the oscillator circuit of the invention;

Fig. 3 is a diagram of the characteristics of the oscillator circuit of Fig. 2; and Fig. 4 shows a modification of the novel oscillator circuit of the invention.

A high frequency oscillator including an electron tube is normally biased beyond cut-off or conduction by the application of a negative potential through a grid leak resistor. A positive pulse of sufficient magnitude to overcome the bias may be applied to the grid circuit to cause conduction in the tube and operation of the oscillator. Normally the oscillator would operate as long as the bias is overcome. However, in accordance with the objects of the invention, a high frequency controlled gaseous discharge tube is provided to make the oscillator self-latching. The gaseous discharge tube is energized by the output of the oscillator to connect a source of positive potential to the grid circuit, the latter potenial also being of sufficient magnitude to overcome the bias. Therefore, once oscillation starts, the bias is overcome and the oscillator remains operating even after the initiating signal is removed.

Referring to the drawings and particularly Fig. 1, there is shown a neon gas diode tube which is employed in the invention. This gas tube has a conductive coating 5 which is connected to a source of high frequency 4, the high frequency circuit being completed from the conductive band 5 through the gas in the tube, the electrodes 2 and the condensers 6 to ground. Normally, the impedance between electrodes 2, measured at points 7 and 8, is infinite for voltages less in value than the ordinary direct current firing potential of the gas tube. However, when high frequency is applied to the conductive band 5, the gas in the tube becomes ionized and a voltage difference between points 7 and 8, much less than the direct current firing potential, causes current to flow through the tube in a direction depending upon the polarity of the voltage difference. The greater the amount of high frequency energy supplied to the conductive band 5, the lower the impedance between points 7 and 8 becomes. The response time for either lowering or raising the impedance between the electrodes, by the application or removal of the high frequency, is of the order of one microsecond or less.

Fig. 2 shows a tuned plate, reverse feed-back type of oscillator in which the plate of tube T1 is connected through a coil L1 of a mutual inductance unit to a battery power supply E*bb*. The coil L1 is shunted by a condenser C1. The grid of the tube T1 has an alternating current path to ground through a condenser C2 in series with a coil L2 of the mutual inductance unit, and a direct current path to ground through a grid leak resistor 11, an ammeter 13 and a variable voltage source V3.

The output of the oscillator is coupled in a novel manner from the plate through a condenser 10 to the conductive bands 5*a* to 5*n*, of N gas tubes 1*a* to 1*n* inclusive. These gas tubes are the type shown in Fig. 1 and described above. The gas diode 1*a* has one electrode connected to the grid leak resistor 11 and the other electrode connected through a resistor 12 to a source of positive potential E2.

The ammeter 13 measures the current I–3 which flows through the variable voltage source V3, while a voltmeter 14 is used to measure the potential of that voltage source. The diodes 1*a* to 1*n*, inclusive, are energized by the high frequency output of the oscillator when the potential of the ground side of the grid leak resistor is positive enough to allow the tube T1 to conduct appreciably.

In Fig. 3, the current I–3, in milliamperes, is plotted as a function of the potential V3, in volts, the function being represented by the curve 15. At a bias voltage slightly more negative than 16 volts (note point *b*) the tube T1 is cut off and the oscillator does not operate. As the voltage V3 is made more and more positive, the oscillator begins to operate, at first feebly, then stronger and stronger. The curve 18 is a plot of the oscillator output voltage versus the voltage V3.

It should be noted (see Fig. 2) that the current I–3 is made up of two components, one being the current I–1 through the resistor 11, the other being the current from the voltage source E2 through the resistor 12 and the gas diode 1*a*. The current I–1 is a negative component of the current I–3 whereas the current I–2 is a positive component. (See arrows indicating direction of flow in Fig. 2.)

As the voltage V3 is made more positive and the oscillator starts operating, the current I–1 is at a low value since the tube T1 is near cut-off and the output of the oscillator and hence the feedback through the mutual inductance unit is very small. The current I–1 is dependent on grid current and the grid is not driven positive to any great degree due to the small amount of feedback so that I–1 increases very little.

At the same time, the component I–2 increases at a rapid rate since the impedance of the gas diode 1*a* decreases rapidly as a function of the magnitude of the high frequency output. In other words, as the voltage V3 is made more positive from the cut-off point, both I–1 and I–2 increase but I–2, the positive component of I–3, increases at a faster rate.

However, after a certain value of V3 is reached, I–2 increases at a slower rate since the voltage difference between the positive supply E2 and the variable voltage V3 decreases faster than the resistance of the gas diode 1*c* decreases. However, the positive swing of the grid of the tube T1 continues to increase as the output of the oscillator increases, and, as a result, the current I–1 starts to increase at a greater rate than the current I–2. As shown by curve 15, the net result is that I–3, the current through the variable voltage supply and having components of I–1 and I–2, increases to a maximum value as the variable voltage V3 is made more positive (decrease in negative potential) to a value of approximately minus 9 volts. Then, as the variable voltage V3 continues to be made more positive, the current I–3 decreases and goes to zero as V3 approaches a value of plus 10 volts.

The variable voltage V3 of Fig. 2 is replaced in Fig. 4 by a resistor 16 and a fixed voltage power supply E3. The values of the resistor 16 and the voltage E3 are such that a load line 17 (Fig. 3) results. This load line 17 intersects the curve 15 at three points, "*a*," "*c*," and "*e*." Point "*c*" is an unstable operating point since a tendency for the bias voltage to go positive increases the current flow through the resistor 16. This current flow through the resistor 16 results in an increased voltage across the resistor of a polarity which aids the tendency of the bias voltage to go more positive. The reverse is also true, a tendency of the bias to decrease being aided by a decrease in current. Therefore, any tendency toward an unbalance when the oscillator is operating at point "*c*" is amplified or aided and, as a result, the operating point moves to point "*a*," a point of stable operation, or to beyond the cut-off point "*b*" to another stable point "*e*." Point "*e*" is the point of no current flow where the load line 17 crosses the curve 15, the bias voltage at that point being the voltage of the power supply E3.

Point "*a*" is a point of stable operation because the circuit opposes any tendency of the bias voltage to change. For example, should the bias voltage tend to increase in a positive direction, the current I–3 decreases which decreases the voltage across the resistor 16. The decrease in voltage across the resistor 16 compensates for the tendency of the bias to increase.

The value of the resistance 16 is selected such that point "*a*," the point of stable operation, falls under point "*d*," on the output curve 18. The selection of point "*d*" as an operating point is governed by the necessity of obtaining a proper high frequency output to secure operation of the gas tubes 1*a* to 1*n*.

The oscillator then may be shifted to operating or to non-operating conditions by application of a signal of proper polarity and magnitude to the junction of resistors 11 and 16 (Fig. 4). If the oscillator is operating at point "*a*" and a negative pulse is emitted from a source 19 (Fig. 4) through the condenser C4 to the junction of resistors 11 and 16, the oscillator may be shifted to a non-operating condition. The pulse must be at least of sufficient magnitude to drive the bias voltage V3 from its value at point "*a*" (approximately plus 2 volts) to a value at a point beyond the peak of I–3 (value is approximately minus 10 volts). The oscillator is then operating at an unbalanced condition, the current I–3 is tending to decrease and that tendency to decrease is aided, as explained above, to a point where conduction of the tube stops (point "*b*" on curve 15). Naturally, for more stable operation, the pulse should drive the bias voltage beyond the cut-off point. Once the oscillator is cut off, the gas tube 1*a* is deenergized and the bias voltage is equal to the voltage value of the power supply E3.

The oscillator may be shifted from a non-operating to an operating condition by application of a positive pulse to the junction of resistors 11 and 16. This pulse from a source 19 via the condenser C4 must be of sufficient magnitude to drive the potential of the junction from the value of the supply E3 to a value less negative than that occurring at the peak of I–3, for example to a point less negative than minus 10 volts. The oscillator starts oscillating and the gas tube 1*a* is energized to connect the power supply E2 to the junction of resistors 11 and 16. Even though the pulse from the source 19 terminates, the combination of resistors 11, 12 and 16 and the power supplies of E2 and E3 result in a bias potential stabilized at operating point "*a*" or approximately plus 3 volts.

The gas tubes 1*b* through 1*n* may be used as switches to close any other circuits.

The characteristic features of the invention are the oscillator, herein disclosed, having means in the load circuit, in the form of high frequency controlled gaseous discharge tubes, for connecting a source of potential to the bias supply to sustain oscillation once operation is started. Of course, many means could be used, other than the one shown, to pulse the circuit. For example, pulses could be transformer coupled to the mutual inductance unit (coils L1 and L2) to start and stop operations.

The particular parameters used in the circuit shown are:

| | |
|---|---|
| Resistor **11** | 10K. |
| Resistor **12** | 12K. |
| Resistor **16** | 180K. |
| E*bb* | +300 volts. |
| E–3 | −100 volts. |
| E–2 | +75 volts. |
| C–1 | 100 micromicrofarads. |
| C–2 | 500 micromicrofarads. |
| C–3 | .01 microfarad. |

T–1 is one half of a 12AU7 tube.

While there has been shown and described and pointed out the fundamental novel features of the invention as applied to a single modification, it will be understood that various omissions and substitutions and changes as in the form and details of the device illustrated and in its operation may be made by those skilled in the art without departing from the spirit of the invention. It is the intention, therefore, to be limited only as indicated by the scope of the following claims.

What is claimed is:

1. An apparatus for producing electrical oscillations comprising in combination, an electrical oscillating circuit, said circuit including an electron discharge tube, said circuit oscillating when the electron discharge tube is in a conducting condition, a control circuit providing a negative bias, connected to said electron discharge tube to maintain the tube in a non-conductive condition, means pulsing the tube into a conducting condition, a gaseous discharge tube energized by the output of said oscillating circuit when the tube is in a conducting condition and electrical means, controlled through said energized gaseous discharge tube to said control circuit, to overcome said bias and maintain said oscillating circuit in an operating condition.

2. An apparatus for producing electrical oscillations comprising in combination, an oscillator, said oscillator including an electron discharge tube, a source of negative bias connected to said electron discharge tube to maintain the tube in a non-conductive condition, means pulsing the tube into a conducting condition, and means holding said tube in a conducting condition, said holding means including an electrical field produced by the output of said oscillating circuit, a gaseous medium energized by said field, a source of electromotive force connected through said energized gaseous medium to the control circuit, the electromotive force being of sufficient magnitude and polarity to counteract the bias.

3. A high frequency oscillator, means pulsing said oscillator to an operating condition, and means maintaining said oscillator in an operating condition, said last named means including a source of potential, and a switch connected between said source and said oscillator, said switch being controlled by the output of said oscillator.

4. A high frequency oscillator including a bias supply, means pulsing said oscillator to an operating condition, and means maintaining said oscillator in an operating condition, said last named means including a gaseous discharge tube having at least two electrodes and a conductive band thereon, one electrode of said gaseous discharge tube being connected to a source of potential, the other electrode of said gaseous discharge tube being connected to said bias supply, the output of said oscillator being coupled to said conductive band to energize said gaseous discharge tube to thereby connect the source of potential to the bias supply.

5. A high frequency oscillator including an electron discharge tube having a control electrode, bias means including impedances connected between said control electrode and a source of negative potential for maintaining said tube in a non-conducting condition, a high frequency controlled diode having two electrodes and a conductive band thereon, means coupling the output of said electron discharge tube to said conducting band, the diode having one electrode connected to a source of positive potential and another electrode connected to said impedances, and pulse means applied to render the electron discharge tube conductive, said diode being energized by the output of said tube to connect said positive potential to said bias means to thereby maintain the electron discharge tube in said conductive condition.

References Cited in the file of this patent

UNITED STATES PATENTS

| | | |
|---|---|---|
| 1,835,387 | Gerth | Dec. 8, 1931 |
| 2,103,439 | Swart | Dec. 28, 1937 |
| 2,292,439 | Golicke | Aug. 11, 1942 |
| 2,365,568 | Langer | Dec. 19, 1944 |
| 2,434,400 | Easton | Jan. 13, 1948 |
| 2,593,350 | Seybold | Apr. 15, 1952 |
| 2,604,589 | Burns | July 22, 1952 |